United States Patent [19]
Dobkin

[11] Patent Number: 5,691,642
[45] Date of Patent: Nov. 25, 1997

[54] METHOD AND APPARATUS FOR CHARACTERIZING A PLASMA USING BROADBAND MICROWAVE SPECTROSCOPIC MEASUREMENTS

[75] Inventor: Daniel M. Dobkin, Sunnyvale, Calif.

[73] Assignee: Trielectrix, Sunnyvale, Calif.

[21] Appl. No.: 508,366

[22] Filed: Jul. 28, 1995

[51] Int. Cl.$^6$ .......................... G01N 27/62; G01L 21/30; B01D 59/44; H01J 49/36

[52] U.S. Cl. .......................... 324/464; 324/459; 324/637; 324/639; 250/282; 436/153

[58] Field of Search .......................... 324/459, 460, 324/464, 637, 639; 73/23.28, 23.29, 23.36, 23.37; 376/143; 364/498, 558; 436/153; 315/111.21, 111.31; 250/281, 282

[56] References Cited

U.S. PATENT DOCUMENTS

| | | | |
|---|---|---|---|
| 4,951,602 | 8/1990 | Kanai | 118/719 |
| 5,180,985 | 1/1993 | Zoccarato et al. | 324/639 X |
| 5,194,731 | 3/1993 | Turner | 250/281 |
| 5,308,977 | 5/1994 | Oishi et al. | 315/111.21 X |
| 5,519,215 | 5/1996 | Anderson et al. | 250/288 |
| 5,545,895 | 8/1996 | Wright et al. | 364/498 X |

OTHER PUBLICATIONS

Francis F. Chen, "Introduction to Plasma Physics and Controlled Fusion," Plenum Press, 2nd Edition, chapter 4, eps., p. 114 ff., (1984) (month unavailable).

H. Meuth and E. Sevillano, "Microwave Plasma Diagnostics," Massachussetts Institute of Technology Report PFC/JA–87–42, (1987) (month unavailable).

M. Heald, C. B. Wharton, "Plasma Diagnostics with Microwaves," Robert E. Krieger Publishing Company, New York, (1978) (month unavailable).

R.M. Moroney, A.J. Lichtenberg, and M.A, Lieberman, "Cavity perturbation measurement of plasma density in complex geometric RF discharges," J. Appl. Phys. 66 1618 (1989) (month unavailable).

W. McColl, C. Brooks and M. L Brake, "Electron density and collison frequency of microwave–resonant–cavity–produced discharges," J. Appl. Phys. 74 #6 3724 (1993) (month unavailable).

(List continued on next page.)

Primary Examiner—Glenn W. Brown
Attorney, Agent, or Firm—Cooley Godward LLP; Peter R. Leal

[57] ABSTRACT

A method and apparatus for accurately characterizing the electron density and distribution of a confined plasma on the basis of high-frequency, broadband electromagnetic measurements is disclosed herein. The technique involves noninvasive, broadband measurement of electromagnetic transmission through a plasma. In one implementation, multivariate analysis techniques are employed to correlate features of the resultant spectra with plasma characteristics such as electron density or electron distribution. Alternately, such techniques are used to correlate the resultant spectra with parameters relating to conditions under which the plasma is generated. More specifically, the quantitative plasma characterization technique involves generating a set of broadband calibration spectra by measuring transmission of electromagnetic energy through a calibration plasma. Each broadband calibration spectrum is obtained using a different set of reference parameters being related to predefined quantitative characteristics. The reference parameters may comprise known values of quantitative characteristics of the calibration plasma including, for example, electron distribution or electron density. Alternately, the reference parameters may comprise known values of operating conditions within the chamber bearing a predetermined empirical relationship to particular plasma quantitative characteristics. A reference parameter transformation, which relates measured spectra of electromagnetic energy transmitted through the calibration plasma to values of the reference parameters, is derived on the basis of the broadband calibration spectra. A test spectrum is then obtained by measuring transmission of electromagnetic energy through a subject plasma. Values of the predefined quantitative characteristics of the subject plasma are then determined by analyzing the test spectrum using the reference parameter transformation.

25 Claims, 4 Drawing Sheets

OTHER PUBLICATIONS

C.A.M. de Vries, A.J. van Roosmalen and H.T. Arends, "Electrical Behavior of RF Plasmas For Dry Etching," IEE Colloquium on Plasma Processing for Semiconductors: Gas Discharge and Surface Aspects, Digest #79, pp. 1/1–3 (Oct. 1984).

David M. Halland, "Multivariate Calibration Methods Applied to the Quatitative Analysis of Infrared Spectra," Computer-Enhanced Analytical Spectroscopy, vol. 3, Ed. P. Jus; Plenum Press, New York (1992) (month unavailable).

Reza Shadmehr, David Angell, Paul Chou, Gattlieb Oehrlein, and Robert Jaffe, "Principle Component Analysis of Optical Emission Spectroscopy and Mass Spectrometry: Application to Reactive Ion Etch Process Parameter Estimation Using Neural Networks," J. Electrochem. Soc., vol., 139, No. 3, (Mar. 1992).

Brian Everitt and Graham Dunn, "Applied Multivariate Data Analysis," Oxford University Press, New York, (1992) (month unavailable).

Noah Hershkowitz, "How Langmuir Probes Work," Chapter 3 of Plasma Diagnostics, Academic Press (1989) (month unavailable).

C.A.M. de Vries, A.J. van Rossmalen, and G.C.C. Puylaert, "Microwave spectroscopic measurement of the electron density in a planar discharge: Relation to reactive-ion etching of silicon oxide," J. Appl. Phys. #57 (9), (May 1985).

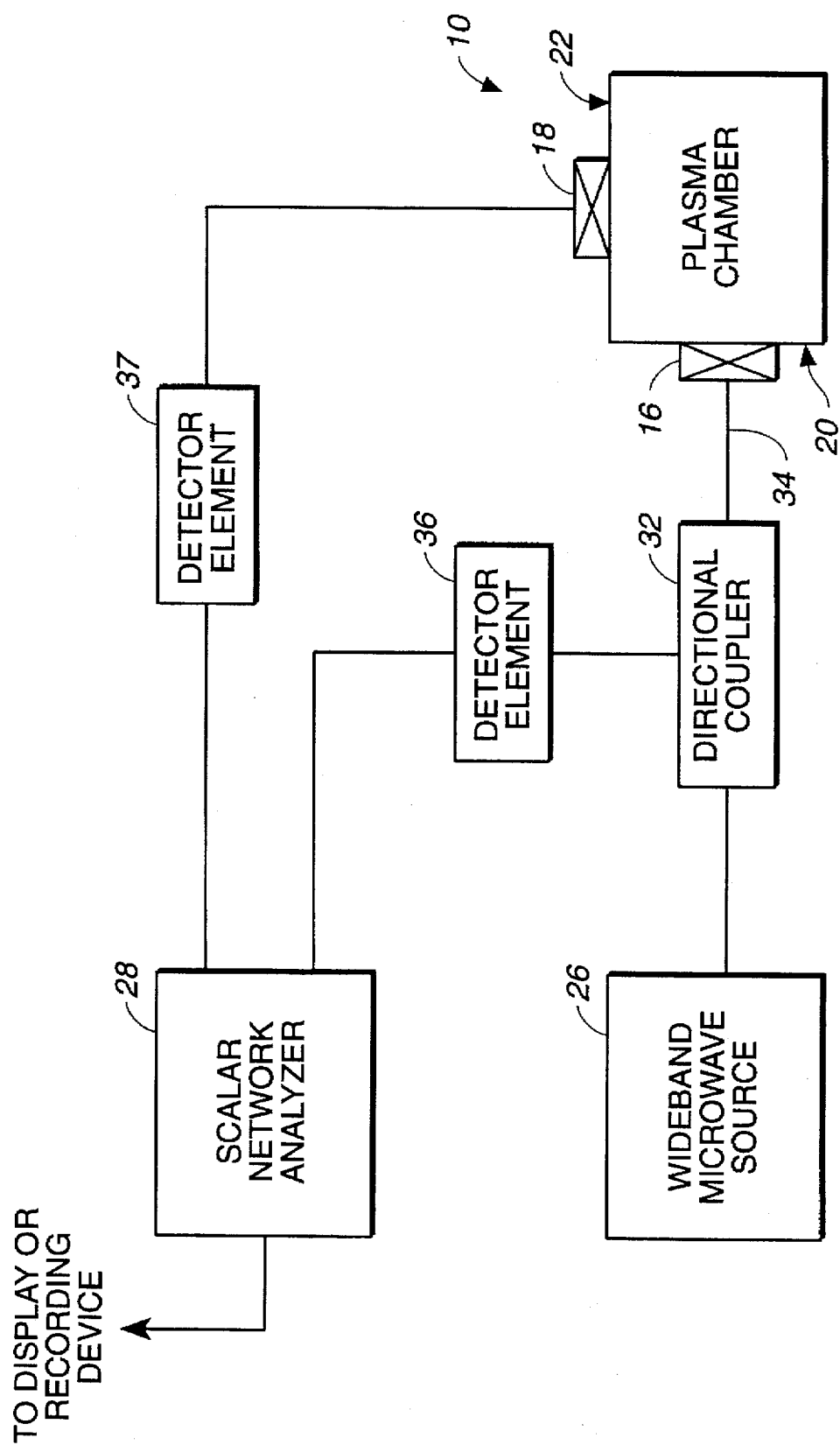
FIG._1

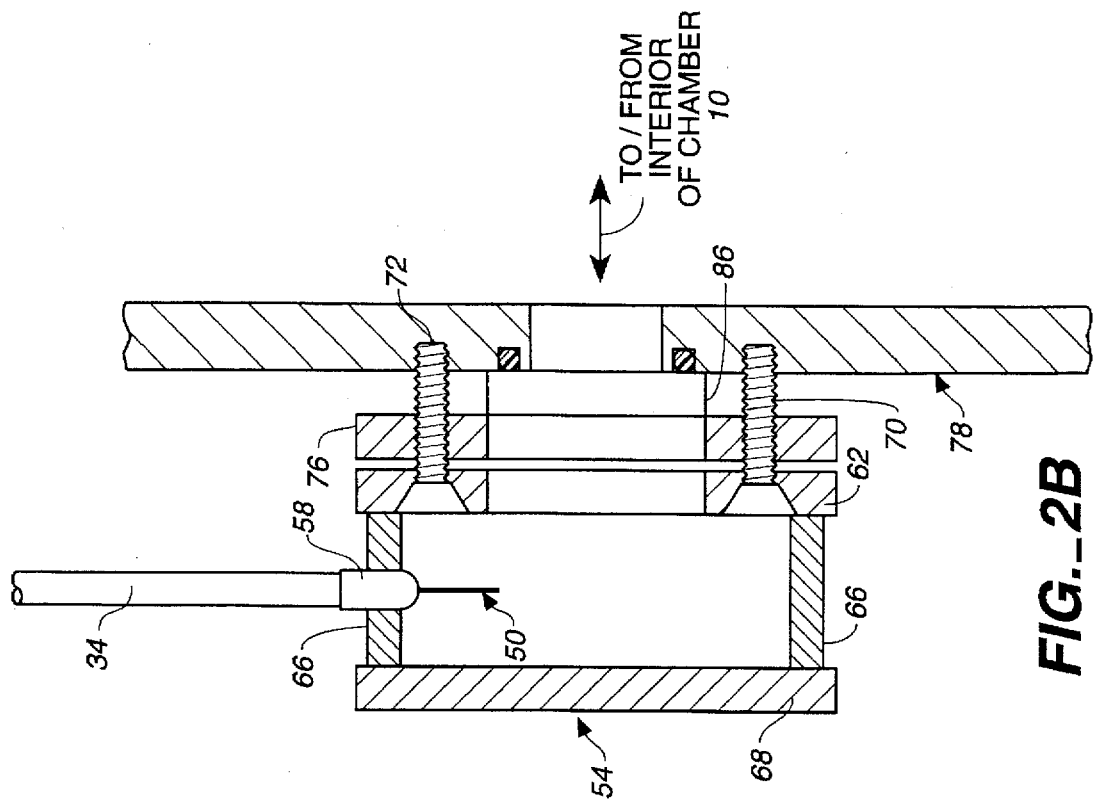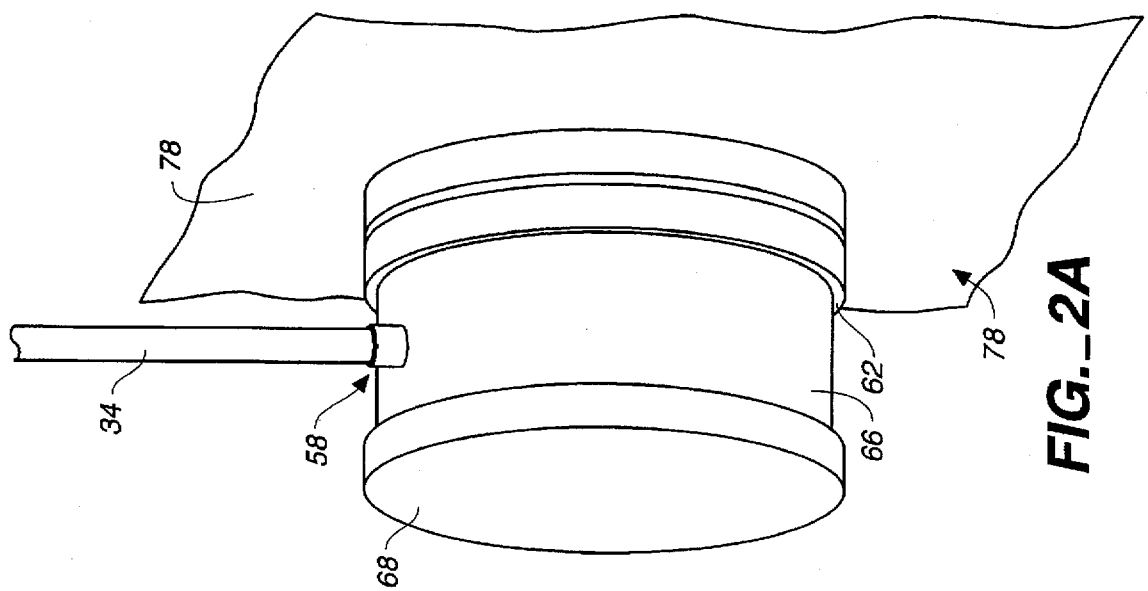

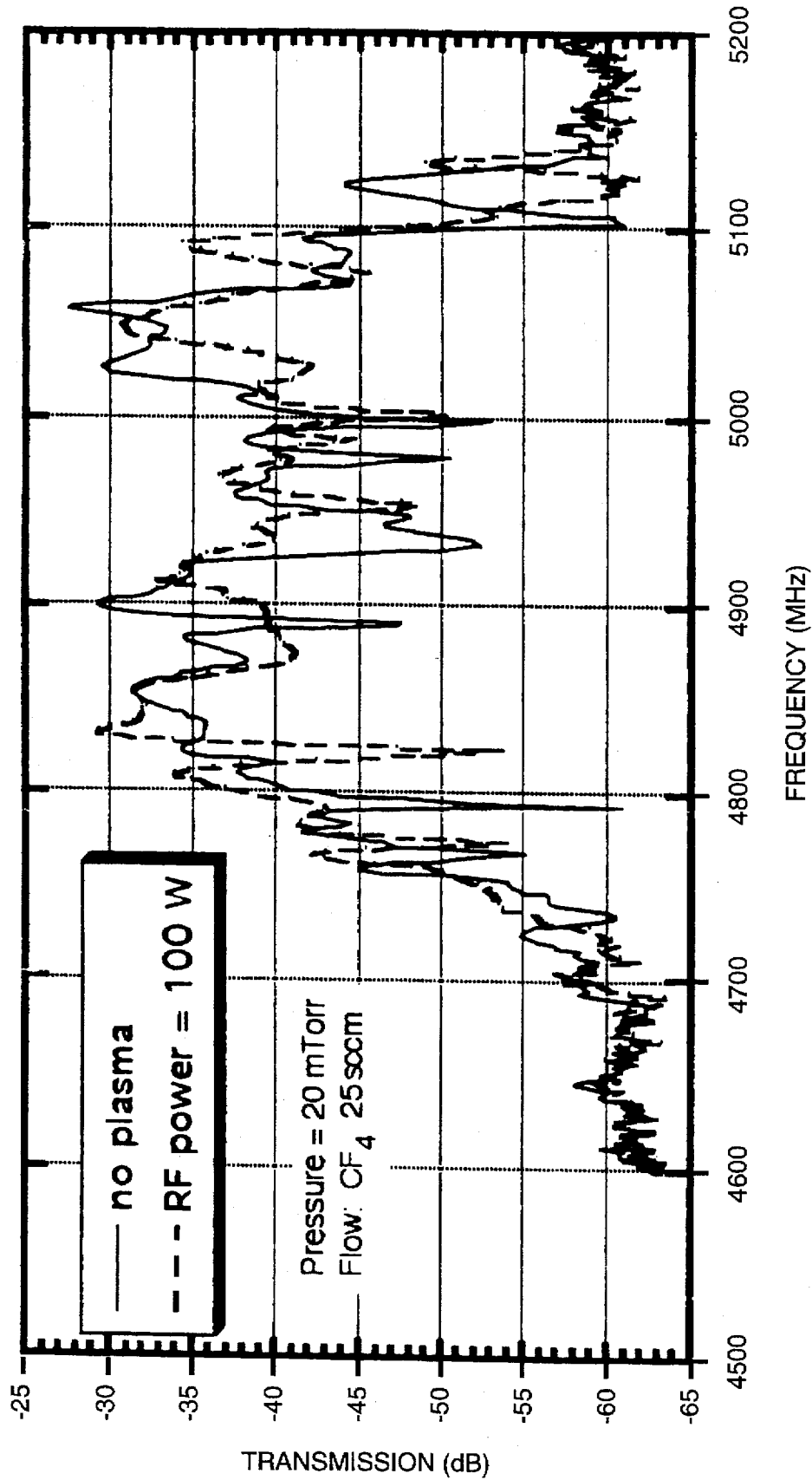
FIG._3

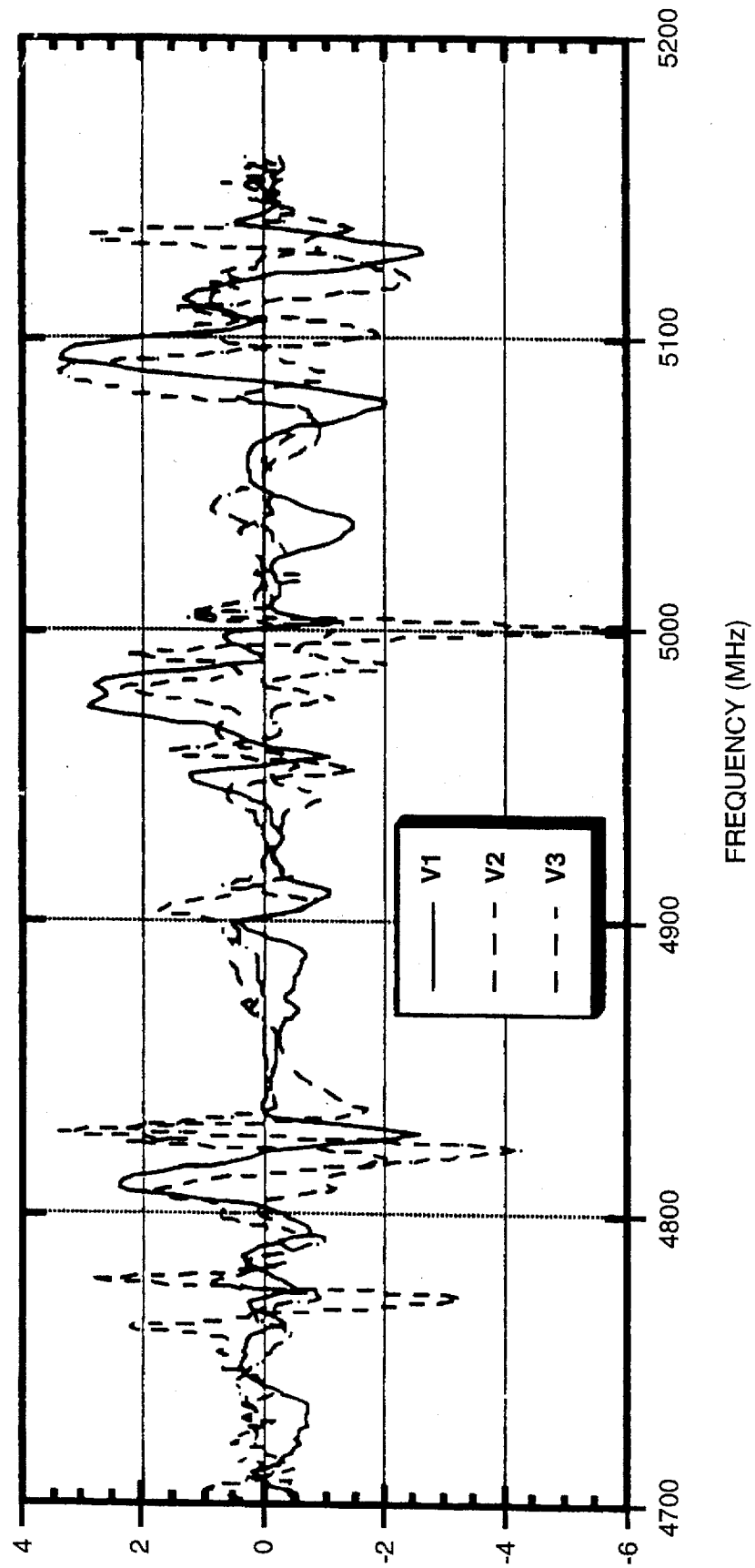
FIG._4

METHOD AND APPARATUS FOR CHARACTERIZING A PLASMA USING BROADBAND MICROWAVE SPECTROSCOPIC MEASUREMENTS

BACKGROUND OF THE INVENTION

I. Field of the Invention

The present invention relates to techniques for characterizing electron plasmas. More particularly, the present invention relates to a novel method and apparatus for plasma characterization which employs broadband microwave spectroscopic measurements.

II. Description of the Related Art

Measurements of the density of electrons in a plasma, as well as of the spatial distribution of electron density within a plasma, are required in a variety of industrial and scientific applications. For example, such measurements are employed in the semiconductor processing industry to facilitate fabrication of integrated circuits and related electronic devices. Within the semiconductor industry, the increased use of plasmas of high electron density under controlled chamber conditions has increased the need for real-time plasma characterization. In particular, real-time monitoring and control of the spatial distribution of electrons in the plasma will likely be necessary to meet the uniformity requirements relating to processing of the next generation of integrated circuits. It is desirable that the measurements required for plasma characterization be performed with minimal disturbance to the plasma; that is, that such measurements be done without invading the plasma chamber.

Accordingly, various techniques employing microwave measurements have been developed to enable noninvasive plasma characterization. For example, electron density and electron collision frequency of the plasma have been ascertained by observing change in the resonant frequency and quality factor (Q) of microwave chamber resonances, respectively. Interferometric techniques have also been employed to estimate electron density through measurement of the phase change of a microwave beam propagating through the plasma. A brief description for the basis for such microwave plasma characterization techniques will now be provided.

Within an unmagnetized, collision-free plasma of moderate electron temperature, the velocity of propagation of an electromagnetic wave therein may be expressed as:

$$V_\phi = c(\omega^2/(\omega^2 - \omega_p^2))^{1/2} \quad [1]$$

where $V_\phi$ is the phase velocity of the wave of frequency $\omega$, c is the velocity of light in vacuum, and $\omega_p$ is the plasma frequency. The plasma frequency, $\omega_p$, is given by:

$$\omega_p = [(q^2 n_e)/(\epsilon_o m_e)]^{1/2} \quad [2]$$

where q denotes the magnitude of the charge of an electron, $n_e$ is the density of electrons within the plasma, $m_e$ is the mass of an electron, and $\epsilon_o$ the dielectric constant of free space.

Considering now equation [1], for $\omega \gg \omega_p$ the phase velocity of electromagnetic energy through the plasma is approximately equal to the phase velocity in free space (i.e., $V_\phi \approx c$). That is, the plasma has minimal effect upon the phase velocity $V_\phi$. As the frequency, $\omega$, of the electromagnetic energy coupled into the plasma is reduced to near $\omega_p$, the propagation velocity $V_\phi$ increases toward a maximum value. For electromagnetic energy below the plasma frequency ($\omega < \omega_p$), the energy does not propagate through the plasma and decays exponentially upon being introduced therein.

Various techniques for characterizing plasmas are predicated on these relationships between plasma frequency, $\omega_p$, and electromagnetic phase velocity $V_\phi$. Given that the plasma frequency for typical plasmas generated under laboratory conditions ranges from a few hundred MHz to about 30 GHz (i.e., $n_e \cong 10^9$ to $10^{13}$ electrons/cm$^3$), such techniques typically involve the introduction of a microwave beam into the plasma. Existing microwave plasma characterization techniques generally fall into one of two categories: (i) techniques in which the phase shift of the introduced microwave beam due to propagation through the plasma is measured using, e.g., interferometric methods, and (ii) methods in which the perturbation, due to the presence of a plasma therein, of the microwave resonant frequency of a single mode of a resonant cavity is detected.

Interferometric approaches rely upon the principle that the phase velocity of a microwave beam introduced into a plasma is altered during propagation therethrough in roughly linear proportion to the plasma's electron density. The phase shift experienced by the continuous-wave beam during propagation within the plasma is compared, using interferometric techniques, to the phase shift of the wave occurring during propagation through free space. Average electron density within the plasma is then estimated based upon the differential phase value obtained as a result of this comparison. Unfortunately, interferometric approaches typically involve use of continuous-wave microwave beams having frequencies which are considerably higher frequency than $\omega_p$, and having wavelengths which are small relative to the physical extent of the plasma. That is, interferometric approaches are typically of limited utility in characterizing plasmas of large physical dimension or high electron density.

When interferometric methods are employed, microwave radiation of a frequency several times larger than the plasma frequency must be used in order that the measured differential phase value be small compared to $\pi$, thereby preventing ambiguities from arising during its measurement. Additionally, in order to ascertain the spatial distribution of electrons within the plasma, the microwave beam must unfortunately be physically shifted from one place to another within the plasma. Moreover, the beam must be small in extent compared to plasma nonuniformities in order to avoid refractive effects.

The use of perturbation techniques involves confining electromagnetic waves within metallic boundaries (cavities), thereby forcing the confined electromagnetic energy to oscillate in specific resonant modes at corresponding well-defined resonant frequencies, $\omega_r$. Perturbation techniques rely on the fact that the presence of a plasma within a cavity leads to a change in the resonant frequency of each mode. For low plasma densities (i.e., for $\omega_r \gg \omega_p$), or for plasmas of small spatial extent relative to the cavity dimensions, the shift in frequency is linearly related to the average electron density. For relatively simple cavity geometries the patterns of the "unperturbed" fields may be determined, which allows this shift in frequency to be determined using perturbation theory. Particular perturbation methods have employed narrow-band microwave radiation as a means of exciting a single mode of a resonant cavity, and are based upon determination of the shift in resonant frequency of the mode due to the presence of a plasma within the cavity. That is, the degree of this shift in resonant frequency is typically determined by comparing the resonant frequency measured in the presence of a plasma to the cavity's nominal resonant frequency in the absence of a plasma. In general, perturbation techniques have been used with resonant cavities of relatively simple geometry, hence permitting estimation of the electromagnetic field configurations within the cavities using conventional analytical techniques. Such estimation of field configurations is necessary in order to determine the expected frequency and spatial characteristics of the resonant modes under observation. Although such conventional analytical techniques have allowed perturbation approaches to be used with more complex cavity geometries, the application of perturbation approaches to arbitrarily complex cavity geometries has been not generally been possible given the incapability of conventional analytical techniques to accurately predict the resonant characteristics of such complex geometries.

OBJECTS OF THE INVENTION

Accordingly, it is an object of the present invention to provide a technique for plasma characterization which may be employed using arbitrarily complex cavity geometries.

It is another object of the present invention to use broadband microwave measurements to simultaneously measure resonance spectra at a plurality of frequencies, and to employ multivariate techniques to analyze the measured spectra in order to facilitate plasma characterization.

It is yet another object of the present invention that to provide a technique for plasma characterization in which such multivariate techniques may be applied to plasmas of relatively large physical extent or high electron density.

It is a further object of the present invention to provide a method of plasma characterization which enables estimation of electron distribution within the plasma without the need for introduction of an electromagnetic beam into the plasma from multiple locations.

Still another object of the present invention is to provide a method of plasma characterization in which it is unnecessary to analytically predict the field distribution associated with particular resonant cavity modes.

SUMMARY OF THE INVENTION

In summary, the present invention provides a novel method and apparatus for accurately characterizing the electron density and distribution of a confined plasma on the basis of high-frequency, broadband electromagnetic measurements. The diagnostic techniques presented herein are apposite not only to plasmas of uniform electron distribution and larger physical extent than the wavelength of the incident electromagnetic (e.g., microwave) energy, but may also be employed to characterize plasmas of low density and limited spatial dimension.

The novel method of plasma characterization described herein involves noninvasive, broadband measurement of electromagnetic transmission through a plasma. In one implementation, multivariate analysis techniques are employed to correlate features of the resultant spectra with plasma characteristics such as electron density or electron distribution. Alternately, such techniques are used to correlate the resultant spectra with parameters relating to conditions under which the plasma is generated.

More specifically, the quantitative plasma characterization technique contemplated by the invention involves generating a set of broadband calibration spectra by measuring transmission of electromagnetic energy through a calibration plasma. Each broadband calibration spectrum is obtained using a different set of reference parameters being related to predefined quantitative characteristics. The reference parameters may comprise known values of quantitative characteristics of the calibration plasma including, for example, electron distribution or electron density. Alternately, the reference parameters may comprise known values of operating conditions within the chamber. In the latter case the reference parameters may bear a predetermined empirical relationship to particular plasma quantitative characteristics.

A reference parameter transformation, which relates measured spectra of electromagnetic energy transmitted through the calibration plasma to values of the reference parameters, is derived on the basis of the broadband calibration spectra. A test spectrum is then obtained by measuring transmission of electromagnetic energy through a subject plasma. Values of the predefined quantitative characteristics of the subject plasma are then determined by analyzing the test spectrum using the reference parameter transformation.

BRIEF DESCRIPTION OF THE DRAWINGS

Additional objects and features of the invention will be more readily apparent from the following detailed description and appended claims when taken in conjunction with the drawings, in which:

FIG. 1 shows a plasma measurement apparatus utilized in a particular implementation of the plasma characterization technique of the present invention.

FIGS. 2A and 2B respectively provide perspective and cross sectional view of an antenna assembly of the type used for coupling electromagnetic energy to and from the resonant chamber of FIG. 1.

FIG. 3 depicts an exemplary calibration spectra and nominal chamber response measured in the presence and absence, respectively, of a plasma within the resonant chamber of FIG. 1.

FIG. 4 graphically depicts the spectra corresponding to a group of three principal components derived from the set of 16 calibration spectra compiled above in (3).

DESCRIPTION OF THE PREFERRED EMBODIMENT

I. Overview of Measurement Apparatus

Referring to FIG. 1, the present invention provides a novel method and apparatus for accurately characterizing plasmas confined within a resonant chamber 10. The inventive plasma characterization technique involves broadband measurement of scalar microwave transmission coefficients of the confined plasma. As is discussed below, the measurements are "broadband" in the sense that transmission of electromagnetic energy through the plasma is measured over a frequency range encompassing a plurality of resonant frequencies of the resonant chamber 10. The resonant chamber 10 is intended to represent a fully functional plasma reactor of conventional design. For purposes of clarity, various ancillary equipment (e.g., sources of RF power and pressurized gases) operative to create a plasma within the chamber 10 are not depicted in FIG. 1.

The measurement apparatus of FIG. 1 includes an exciting antenna 16 and a sensing antenna 18 for coupling a broadband microwave signal to and from, respectively, the plasma chamber 10. In an exemplary implementation the exciting and sensing antennas 16 and 18 are not disposed within the vacuum-sealed interior of the resonant chamber, but are coupled thereto through pre-existing dielectric windows in the wall of the chamber 10. Such physical separation of the exciting and sensing antennas 16 and 18 from the interior of the chamber 10 advantageously reduces the likelihood of contamination thereof by the external atmosphere, and eliminates exposure of the antennas 16 and 18 to corrosive species within the interior of the chamber 10.

The exciting and sensing antennas 16 and 18 may be realized as short dipole or loop antennas, since coupling between the antennas 16 and 18 and electromagnetic fields within the resonant chamber 10 will be amplified due to resonance within the chamber 10. For a chamber of 10 having conductive walls, the resonant modes will be distributed throughout the resonant chamber 10. This obviates the need for the exciting and sensing antennas 16 and 18 to be disposed proximate opposing surfaces of the interior of the chamber 10. For example, if the exciting antenna 16 couples into the chamber 10 through wall 20, the sensing antenna 18 may be disposed proximate an adjacent chamber wall 22. The exciting and sensing antennas 16 and 18 will preferably be mutually separated by a distance sufficient to ensure that the measured transmission of electromagnetic energy therebetween will be approximately zero over frequencies at which resonance does not exist within the chamber 10.

As is indicated by FIG. 1, the measurement apparatus further includes a conventional wideband microwave source 26 and scalar network analyzer 28. Microwave energy produced by the wideband microwave source 26 is coupled with minimal attenuation to the exciting antenna 16 through a directional coupler 32 and input transmission line 34. Similarly, the directional coupler 32 couples an attenuated level of power from the source 26 to a standard detector element 36 linked to the scalar network analyzer 28. Another standard detector element 37 is interposed between sensing antenna 18 and the scalar network analyzer 28. In an exemplary embodiment the wideband microwave source 26 and scalar network analyzer 28 are realized using instruments such as, for example, a Hewlett Packard HP8350B and HP8757A, respectively.

FIGS. 2A and 2B respectively provide perspective and cross sectional views of the exciting antenna 16, wherein the sensing antenna 18 will typically be implemented in a substantially identical fashion. The exciting antenna 16 includes a short dipole or loop antenna element 50 disposed within an external cavity defined by a closed conductive cylinder 54. The antenna element 50 is coupled to the input transmission line 34 through a conventional coaxial transition element 58. Specifically, the coaxial transition element 58 electrically connects the center conductor of transmission line to antenna element 50, and electrically connects the outer conductor of coaxial cable 34 to cylindrical wall 66. The conductive cylinder 54 includes a mating flange 62, the cylindrical wall 66, and a top plate 68, each of which is comprised of a conductive material (e.g., aluminum or copper) selected to minimize resistive losses. These constituent components of the conductive cylinder 54 are joined by conventional means to form the cylindrical cavity in which is disposed the antenna element 50. The conductive cylinder 54 is mounted upon the chamber 10 by a pair of screws 70 and 72, which are seen to pass through a pre-existing port flange 76 prior to being received by an outer wall 78 of the chamber 10.

Energy radiated by the antenna element 50 into the chamber defined by the conductive cylinder 54 impinges upon a pre-existing dielectric window 86 after passing through apertures (dashed lines) defined by the mating flange 62 and port flange 76. This energy is then coupled into the interior of the chamber 10 through the dielectric window 86. The apertures defined by the flanges 62 and 76, together with the aperture (dashed lines) defined by the wall 78 immediately adjacent the dielectric window 86, effectively form a waveguide segment which will not propagate frequencies lower than a waveguide cut-off frequency thereof. Since this waveguide cut-off frequency sets a lower bound upon frequencies capable of being coupled into the chamber 10, it will typically be desirable that the apertures defined by the flanges 62 and 76 be at least as large as the dimensions of the dielectric window 86.

The plasma characterization technique of the present invention is primarily pertinent to the characterization of "low density" plasmas. As used herein, the term "low density" plasma refers to a plasma of a plasma frequency $(\omega_p)$ much less than the lowest resonant mode frequency $(\omega_r)$ of a resonant mode set up within the chamber 10.

II. Low Density Plasma Characterization

When the frequency of a plasma $(\omega_p)$ within the chamber 10 is well below the lowest resonant mode frequency $(\omega_r)$ excited therein, the frequency of each resonant mode excited within the chamber 10 will be slightly perturbed from the frequency at which it would be otherwise excited in the absence of a plasma. The perturbation of these resonant frequencies has been found to be a function of operating conditions within the chamber (e.g., applied RF power, gas pressure), which may be related to physical characteristics (e.g. electron density) of the plasma using any of various empirical techniques described hereinafter. By varying these operating conditions and analyzing the resultant variation in the measured chamber resonant frequencies in the manner described herein, the present invention facilitates determination of a relationship between values of these operating conditions and the spectrum of measured chamber resonant frequencies. In accordance with the invention, this relationship may then be employed to ascertain unknown operating conditions and/or physical plasma characteristics on the basis of the spectrum of chamber resonance frequencies measured under such unknown operating conditions. Prior to describing this plasma characterization technique more fully later in this section, a brief summary is provided immediately below.

SUMMARY OF LOW DENSITY PLASMA CHARACTERIZATION

As an initial step in the inventive plasma characterization technique, a set of calibration spectra are compiled by measuring transmission coefficients through a calibration plasma within chamber 10 over a predetermined spectrum of calibration frequencies under known chamber operating conditions. The value of each transmission coefficient within each calibration spectrum is determined by the scalar network analyzer 28 in the usual way; namely, by comparing the microwave power delivered by the microwave source 26 at a specific resonant frequency of the chamber 10 to the power measured at that resonant frequency by the network analyzer 28. The known operating conditions in existence during compilation of each calibration spectrum form the "reference parameters" associated with the spectrum. Since the chamber operating conditions may be related empirically to physical characteristics of the calibration plasma, the reference parameters may alternately comprise such physical characteristics.

A transformation for each reference parameter (i.e., a "reference parameter transformation") is then determined on the basis of the calibration spectra using multivariate analysis techniques described further hereinafter. In particular, a principal components analysis is employed to derive a set of a relatively few principal spectra. The principal spectra so derived possess the property that each of the calibration spectra may be at least approximately constructed from a linear combination thereof. Linear regression techniques are then employed to relate the set of principal spectra to each reference parameter, wherein the resulting set of linear regressions comprise the reference parameter transformations. In essence, each reference parameter transformation comprises a linear expression useful for estimating the value of a particular reference parameter in existence at the time any subsequent "test spectrum" is measured through a subject plasma within the chamber 10. In this regard each such test spectrum is obtained by measuring the transmission coefficients through the subject plasma over the spectrum of calibration frequencies when the reference parameters are of unknown values. In order to determine these unknown values of the reference parameters, the test spectrum is projected onto each principal spectrum of the reference parameter transformation derived for the given reference parameter. The resulting projections are then linearly combined in accordance with this reference parameter transformation, thereby yielding the value of the given reference parameter in existence during measurement of the test spectrum.

DETAILED DESCRIPTION OF LOW DENSITY PLASMA CHARACTERIZATION

Referring to FIG. 1, the network analyzer 28 determines each calibration spectrum by measuring the transmission amplitude or coefficient through the calibration plasma within chamber 10 at each of a set of N (e.g., N=300) different calibration frequencies spanning a predetermined calibration spectrum (e.g. 3–6 GHz). Hence, each calibration spectrum may be represented as an N×1 column vector comprised of N amplitude values, each amplitude value corresponding to one of the N calibration frequencies. Again, each calibration spectrum is compiled with a different set of reference parameters in effect. As a specific example, each calibration spectrum could be compiled using a different combination of the reference parameters comprised of: (i) the RF power and (ii) oxygen flow provided to the resonant chamber 10, and (iii) the gas pressure within the chamber 10. A data matrix X is then formed by concatenating the column vectors representing each of P (e.g., P=20) calibration vectors. In this way the data matrix X maps the space of P calibration vectors to the space of possible spectra of dimension N.

The N×P data matrix X may be decomposed into the orthonormal matrices U and V, and a diagonal matrix D such that, $$X = UDV^t \qquad [3]$$

The matrix U is of the same dimension as the matrix X; the matrix V is a square matrix with the same number of columns as the matrix X; and the matrix D is a square P×P matrix. The columns of the matrix V may be termed "principal components" of the matrix X, in that these columns form a set of principal axes capable of representing information inherent within the matrix X in a lower dimensional space. More specifically, the diagonal elements of the matrix D, once found, are representative of the extent of the contribution of each column vector of the matrix V to the variation among the calibration vectors of the data matrix X. For most practical applications, it is anticipated that a substantial portion of this variation may be attributed to the vectors corresponding to relatively few (e.g., 3 or 4) of the largest diagonal elements of the matrix D. This advantageously allows the variation of the calibration spectra within N dimensions to be closely approximated using only a small set of the principal components of the matrix X. That is, a relatively large space of dimension N may be reduced through matrix decomposition into a space capable of being represented using a relatively few (e.g., 3 or 4) "dominant" principal components. It is noted that other potentially useful techniques of matrix decomposition are described generally within, for example, B. Everitt and G. Dunn, in *Applied Multivariate Data Analysis;* Oxford University Press (1992); chapters 4 and 13.

Once a set of the dominant principal components of the matrix X has been identified, linear regression techniques may be employed to relate these dominant principal components to the reference parameters in existence during the measurement of each calibration spectra. For example, letting V1, V2, and V3 respectively represent the dominant principal components of the matrix X, each calibration spectrum (i.e., each column $X_c$ of the matrix X) may be decomposed into its projections upon V1, V2, and V3. Each such projection, $Vi_p$, is defined as:

$$Vi_p = X_c \cdot Vi, \text{ for } i=1, 2, 3 \qquad [4]$$

A conventional multiple linear regression may then be performed using the calibration spectra in order to derive a set of expressions relating the dominant principal components to the reference parameters, $RP_n$. More particularly, coefficients $A_i$, $B_i$, and $C_i$ are determined by linear regression such that:

$$RP_i = K_i + A_i \cdot V1_p + B_i \cdot V2_p + C_i \cdot V3_p$$

For the specific case in which three reference parameters are varied during compilation of the calibration spectra, equation [5] yields the following set of linear relationships, which are hereinafter denoted as "reference parameter transformations":

$$RP_1 = K_1 + A_1 \cdot V1_p + B_1 \cdot V2_p + C_3 \cdot V3_p \qquad [6]$$

$$RP_2 = K_2 + A_2 \cdot V1_p + B_2 \cdot V2_p + C_3 \cdot V3_p \qquad [7]$$

$$RP_3 = K_3 + A_3 \cdot V1_p + B_3 \cdot V2_p + C_3 \cdot V3_p \qquad [8]$$

The reference parameter transformations of equations [6]–[8] enable current reference parameter values to be determined on the basis of one or more subsequent "test spectra". Specifically, each test spectrum is collected by measuring transmission through a subject plasma in the chamber 10 over the frequency range used during compilation of the calibration spectra. The N×1 test vector (i.e., a column vector of amplitudes measured at N different frequencies) corresponding to each test spectrum is then projected onto each N×1 dominant principal component by taking the inner product therebetween.

When the reference parameters comprise operating conditions under which the plasma is confined within the chamber 10, physical characteristics of the plasma may nonetheless be obtained from the calculated values of the reference paramaters (i.e., from $RP_1$, $RP_2$, and $RP_3$). As was suggested above, this entails utilization of conventional methods (e.g., Langmuir probe techniques) to establish an empirical relationship between the operating conditions within the chamber 10 and the values of such physical characteristics (e.g., electron density, electron distribution).

In practice, the average transmission amplitude through the plasma will be subtracted from each calibration spectrum prior to compilation of the data matrix X, since only variation in the data matrix X as a function of the values of the reference parameters is of interest. The eigenvectors of the matrix $X^TX$, or equivalently the principal axes of the data matrix X, are representative of the variation in the set of calibration spectra in proportion to their associated eigenvalues. Again, it has been found that a substantial percentage of the variation in the set of calibration spectra is reflected by a few of the dominant eigenvectors of the matrix $X^TX$.

Exemplary Measurement Procedure for Low Density Plasma Characterization

In order to illustrate the application of the principles set forth in the preceding section, a sequence of steps involved in performing low density plasma characterization in accordance with the invention is identified and explained below.

(1) Select a Set of Reference Parameters Upon Which to Base the Calibration Measurements As was mentioned above, the selected reference parameters may correspond either to operating conditions within the chamber 10, or alternately to physical characteristics of plasma confined therein. In the former case, operating conditions such as applied RF power, gas pressure and gas mixture are varied in the manner prescribed by (2) below between measurement of each calibration spectrum. Selection of chamber operating conditions as the reference parameters may be appropriate when, for example, it is desired to track variation of such parameters during subsequent chamber operation. This facilitates identification of drift in chamber operating conditions, and allows measures to be taken to correct for such drift.

Since physical characteristics of the plasma (e.g., electron density) may not in general be directly controlled as required by (2) below, when such physical characteristics comprise the reference parameters an empirical relationship is necessary to be established between these characteristics and chamber operating conditions. As an example, consider a chamber of circular cross section in which the reference parameters of interest are electron density in the center of the chamber, and the first moment of radial electron distribution.

$$n_e(r) = n_{e0} + n_{e1}(r/R)^2 \quad [9]$$

wherein $n_e(r)$ denotes the radial distribution of electron density, $n_{e0}$ represents the electron density in the center of the chamber, $n_{e1}$ is a coefficient of radial variation, r corresponds to the radial distance from the center of the chamber, and R corresponds to the interior radius of the chamber. An empirical relationship between controllable chamber operating conditions (e.g., RF power, oxygen flow) and the quantities $n_{e0}$, $n_{e1}$ may be obtained by fitting equation [9] to measurements of electron density, $n_e(r)$, taken conventionally for several values of r.

(2) Perform a Set of Calibration Measurements Using Different Combinations of Values of the Reference Parameters It is desired that the values of the reference parameters be set differently during measurement of each calibration spectrum. In a preferred embodiment, the variation of the reference parameters over the set of measured calibration spectra is chosen to be "orthogonal". That is, the variation in the value of each reference parameter is designed to be independent of the variation of the other reference parameters. Considering again the example of (1) in which the reference parameters comprise electron density and the first moment of radial variation, suitable combinations of reference parameter values are set forth below for use during measurement of six different calibration spectra:

| Calibration Measurement | $N_{e0}$ | $N_{e1}$ |
|---|---|---|
| 1 | 0 | 0 |
| 2 | + | + |
| 3 | + | − |
| 4 | − | − |
| 5 | − | + |
| 6 | 0 | 0 | where +, 0, and − denote the high, medium, and low values of the reference parameter respectively.

This particular assignment of values to the reference parameters $n_{e0}$ and $n_{e1}$ values may be characterized as being of the two-level, full-factorial type. Procedures describing construction of larger orthogonal sets of values are set forth in, for example, G. Box, W. Hunter and J. Hunter, *Statistics for Experimenters*; Wiley Press, New York (1978).

(3) Generate a Set of Calibration Spectra by Measuring Microwave Transmission as a Function of Frequency for each Combination of Reference Parameter Values Using the apparatus of FIG. 1, microwave energy over a predefined calibration spectrum (e.g., 3 to 6 GHz) is provided to the interior of the resonant chamber 10 via exciting antenna 16. In the preferred embodiment the calibration spectrum is selected to encompass multiple resonant modes of the chamber 10, which are coupled to sensing antenna 18. The transmission measurements comprising each calibration spectrum are conducted for a different one of the combinations of reference parameter values set forth in (2). Each calibration spectrum may be represented as a column vector, where the entry within each row corresponds to the transmission amplitude measured at a particular frequency within the calibration spectrum. Each column vector will generally be normalized by subtracting the average transmission value from each amplitude entry.

In a specific experimental implementation, a set of calibration spectra were obtained for various combinations of gaseous pressure, RF power, and oxygen flow into the chamber 10. The values of the reference parameters were varied during the calibration procedure as follows: gaseous pressure ranged from 20 to 75 mTorr, RF power ranged from 75 to 200 Watts, and gas flow from 0 to 8 standard cm³/minute. In this case sixteen calibration measurements were performed yielding sixteen calibration spectra, each comprised of the amplitude values corresponding to a collection of frequencies between approximately 4.7 and 5.2 GHz. FIG. 3 depicts one of the sixteen calibration spectra (dashed line), together with a response (solid line) collected in the absence of a plasma within the chamber 10.

(4) Analyze the Set of Calibration Spectra Using Principal Components Analysis or Similar Technique for Simplifying High-Dimensional Data As was described above, a data matrix X is compiled by concatenating the normalized column vectors comprising the calibration spectra obtained in (3). Again considering the specific implementation set forth in (3), the data matrix X is constructed so as to be comprised of 16 columns and 307 rows. The sixteen eigenvectors of the matrix $X^TX$ were then determined, and are identified in TABLE I e1, e2, . . . , e16. TABLE I also sets forth the eigenvalue associated with each eigenvector, as well as the proportion of the squared variance in the set of calibration spectra ("Variance Proportion (%)") found to be represented by each eigenvector. TABLE I further indicates the proportion of the squared variance in the set of calibration spectra cumulatively accounted for by a given number of the eigenvectors ("Cumulative %").

TABLE I

| Eigenvalue | | | Variance Proportion (%) | Cumulative (%) |
|---|---|---|---|---|
| e1 | (V1) | 9.854 | 61.6 | 61.6 |
| e2 | (V2) | 3.709 | 23.2 | 84.8 |
| e3 | (V3) | 0.756 | 4.7 | 89.5 |
| e4 | | 0.486 | 3.0 | 92.5 |
| e5 | | 0.401 | 2.5 | 95 |
| e6 | | 0.214 | 1.3 | 96.3 |
| e7 | | 0.191 | 1.2 | 97.5 |
| e8 | | 0.134 | 0.8 | 98.3 |
| e9 | | 0.090 | 0.6 | 98.9 |
| e10 | | 0.069 | 0.4 | 99.3 |
| e11 | | 0.041 | 0.3 | 99.6 |
| e12 | | 0.030 | 0.2 | 99.8 |
| e13 | | 0.011 | 0.0 | ... |
| e14 | | 0.009 | 0.0 | |
| e15 | | 0.006 | 0.0 | |
| e16 | | 0.000 | 0.0 | |

It is observed that the eigenvectors associated with the three largest eigenvalues, i.e., the eigenvectors V1, V2 and V3, or equivalently the principal components of the data matrix X, account for approximately 89.5% of the squared variation in the set of calibration spectra. That is, any of the calibration spectra could be decomposed into a sum of the spectra represented by the eigenvectors V1, V2 and V3, together with a residual term equivalent to approximately 10% of the squared variation in the data. A higher percentage of the squared variation in the calibration spectra could of course be accounted for by including more than three eigenvectors within the set of primary eigenvectors. FIG. 4 provides a graphical depiction of the spectra corresponding to the eigenvectors V1, V2, and V3 derived from the set of 16 calibration spectra compiled above in (3).

Rather than decomposing the calibration spectra into principal components (i.e., into the eigenvectors e1, e2, ..., e16) as described herein, techniques of factor analysis may alternately be employed in analysis of the calibration spectra. Such factor analysis techniques do not involve the intermediate step of fitting primary eigenvectors to reference parameter values via linear regression, but instead directly fit the measured variation in the spectra to the reference parameters.

(5) Determine a Reference Parameter Transformation by Correlating the Primary Eigenvectors with the Value of each Reference Parameter Since each of the eigenvectors of TABLE I are mutually orthogonal by construction, the relationships specified by equations [6]–[8] may be determined between the value of each reference parameter and a linear combination of the primary eigenvectors V1, V2 and V3. For the specific experimental implementation of (3) and (4), the following relationships were derived using the aforementioned linear regression techniques:

$$\text{Gas Pressure} = 28.9 + 2.69 \cdot V1_p + 12.6 \cdot V2_p - 51.6 \cdot V3_p \quad [10]$$

$$\text{RF Power} = 143.145 + 9.41843 \cdot V1_p - 81.6080 \cdot V2_p - 50.8129 \cdot V3_p \quad [11]$$

$$\text{Oxygen Flow} = 2.41399 - 8.90668 \cdot V1_p - 3.50084 \cdot V2_p + 1.58140 \cdot V3_p \quad [12]$$

Where, again, $V1_p$, $V2_p$ and $V3_p$ respectively represent the normalized inner products between the primary eigenvectors V1, V2, V3, and any test spectrum subsequently obtained under unknown conditions.

Accordingly, the value of each reference parameter (e.g., Gas Pressure, RF Power, Oxygen Flow) during subsequent measurement of a test spectrum may be estimated using equations [10]–[12] by making use of the projections (i.e., the normalized inner products $V1_p$, $V2_p$ and $V3_p$) of such a test spectrum upon the primary eigenvectors V1, V2 and V3.

The previous description of the preferred embodiments is provided to enable any person skilled in the art to make or use the present invention. The various modifications to these embodiments will be readily apparent to those skilled in the art, and the generic principles defined herein may be applied to other embodiments without the use of inventive faculty. Thus, the present invention is not intended to be limited to the embodiments shown herein but is to be accorded the widest scope consistent with the principles and novel features disclosed herein.

What is claimed is:

1. A method for measuring quantitative characteristics of a subject plasma confined within a chamber, said method comprising the steps of:

generating a set of calibration spectra by measuring transmission of electromagnetic energy through a calibration plasma confined within said chamber, each calibration spectrum within said set of calibration spectra being obtained using a different set of reference parameters related to said quantitative characteristics;

determining a reference parameter transformation on the basis of said calibration spectra, said reference parameter transformation relating measured spectra of electromagnetic energy transmitted through said calibration plasma to values of said reference parameters;

generating a test spectrum by measuring transmission of electromagnetic energy through said subject plasma; and estimating said quantitative characteristics by analyzing said test spectrum using said reference parameter transformation.

2. The method of claim 1 wherein said step of generating a set of calibration spectra includes the step of transmitting electromagnetic energy through said calibration plasma of substantially higher frequency than an electron plasma frequency of said calibration plasma.

3. The method of claim 1 wherein said electromagnetic energy transmitted through said calibration plasma during said step of generating a set of calibration spectra is generated so as to occupy a frequency band encompassing multiple resonant frequencies of said chamber.

4. The method of claim 1 wherein each said set of reference parameters comprises known values of said quantitative characteristics.

5. The method of claim 4 wherein said quantitative characteristics relate to physical characteristics of said subject plasma and said reference parameters relate to operating conditions within said chamber, said method further including the step of determining an empirical relationship between known values of said quantitative characteristics and known values of said reference parameters.

6. The method of claim 1 wherein each said set of reference parameters comprises known values of operating conditions within said chamber.

7. The method of claim 1 further including the step of generating said sets of said reference parameters so that variation in value of each of said reference parameters over said sets of reference parameters is substantially independent of variation in value of each other of said reference parameters over said sets of reference parameters.

8. The method of claim 1 wherein said step of estimating said quantitative characteristics includes the step of using a predefined empirical relationship between said quantitative characteristics and said reference parameters to ascertain values of said quantitative characteristics.

9. The method of claim 1 wherein said step of determining said reference parameter transformation includes the steps of:

characterizing said calibration spectra in terms of a plurality of principal axes, projecting each of said calibration spectra upon a subset of said plurality of principal axes in order to form a set of calibration projections, and regressively fitting said calibration projections to said values of said reference parameters in order to obtain a regression relationship between said subset of said plurality of principal axes and said reference parameters.

10. The method of claim 9 wherein said step of determining said calibration set further includes the step of forming said subset of said plurality of principal axes by selecting those of said plurality of principal axes most contributing to variation in said calibration spectra.

11. The method of claim 9 wherein said step of estimating said quantitative characteristics includes the step of performing a projection of said test spectrum upon said plurality of principal axes in order to obtain a set of test projections.

12. The method of claim 11 wherein said step of estimating said quantitative characteristics includes the step of determining a set of test values of said reference parameters by operating upon said set of test projections using said regression relationship.

13. The method of claim 12 wherein said step of estimating said quantitative characteristics includes the step of relating said test values of said reference parameters to values of said quantitative characteristics using a predefined relationship.

14. An apparatus for measuring quantitative characteristics of a subject plasma confined within a chamber, said apparatus comprising:

a calibration network for generating a set of calibration spectra by measuring transmission of electromagnetic energy through a calibration plasma, each calibration spectrum within said set of calibration spectra being obtained using a different set of reference parameters related to said quantitative characteristics;

means for determining a reference parameter transformation on the basis of said calibration spectra, said reference parameter transformation relating measured spectra of electromagnetic energy transmitted through said calibration plasma to values of said reference parameters;

a test measurement network for generating a test spectrum by measuring transmission of electromagnetic energy through said subject plasma; and means for estimating said quantitative characteristics by analyzing said test spectrum using said reference parameter transformation.

15. The apparatus of claim 14 wherein said calibration network includes means for transmitting electromagnetic energy through said calibration plasma of substantially higher frequency than an electron plasma frequency of said calibration plasma.

16. The apparatus of claim 14 wherein said calibration network includes means for generating said electromagnetic energy transmitted through said calibration plasma such that electromagnetic energy occupies a frequency band encompassing multiple resonant frequencies of said chamber.

17. The apparatus of claim 14 wherein each said set of reference parameters comprises known values of said quantitative characteristics.

18. The apparatus of claim 17 wherein said quantitative characteristics relate to physical characteristics of said subject plasma and said reference parameters relate to operating conditions within said chamber, said means for estimating said quantitative characteristics including means for determining an empirical relationship between known values of said quantitative characteristics and known values of said reference parameters.

19. The apparatus of claim 14 wherein each said set of reference parameters comprises known values of operating conditions within said chamber.

20. The apparatus of claim 14 wherein said calibration network includes means for generating said sets of said reference parameters so that variation in value of each of said reference parameters over said sets of reference parameters is substantially independent of variation of in value of each other of said reference parameters over said sets of reference parameters.

21. The apparatus of claim 14 wherein said means for estimating said quantitative characteristics includes means for using a predefined empirical relationship between said quantitative characteristics and said reference parameters to ascertain values of said quantitative characteristics.

22. The apparatus of claim 14 wherein said means for determining said reference parameter transformation includes:

means for characterizing said calibration spectra in terms of a plurality of principal axes, means for projecting each of said calibration spectra upon a subset of said plurality of principal axes in order to form a set of calibration projections, and means for regressively fitting said calibration projections to said values of said reference parameters in order to obtain a regression relationship between said subset of said plurality of principal axes and said reference parameters.

23. A method for measuring the electron density as a function of position within a plasma, which plasma is within a chamber, said method comprising the steps of:

(a) measuring the signal intensity of microwave transmission in the presence of a plasma within a resonant chamber at various frequencies over a frequency range encompassing a plurality of resonant frequencies of said chamber, said signal intensity of said microwave transmission being normalized at each of said various frequencies by the signal intensity of said microwave transmission detected at said frequency in the absence of the plasma; and (b) using at least one empirical multivariate technique to analyze said signal intensities to yield estimates of the electron density as a function of position within said plasma.

24. The method of claim 23 wherein the empirical multivariate technique is the principal components analysis technique.

25. The method of claim 24 wherein the empirical multivariate technique is the factor analysis technique.

\* \* \* \* \*